United States Patent
Sharpe-Geisler

[19]

[11] Patent Number: 6,072,351
[45] Date of Patent: Jun. 6, 2000

[54] OUTPUT BUFFER FOR MAKING A 5.0 VOLT COMPATIBLE INPUT/OUTPUT IN A 2.5 VOLT SEMICONDUCTOR PROCESS

[75] Inventor: Bradley A. Sharpe-Geisler, San Jose, Calif.

[73] Assignee: Advanced Micro Devices, Inc., Sunnyvale, Calif.

[21] Appl. No.: 08/912,763

[22] Filed: Aug. 18, 1997

[51] Int. Cl.⁷ ..................................................... H03K 5/08
[52] U.S. Cl. .......................... 327/328; 327/112; 327/313; 361/91
[58] Field of Search ................................... 327/108, 170, 327/310, 313, 327, 328, 375, 391, 437; 326/87; 361/56, 91

[56] References Cited

U.S. PATENT DOCUMENTS

| | | | |
|---|---|---|---|
| 4,900,955 | 2/1990 | Kurpan | 327/306 |
| 4,956,569 | 9/1990 | Olivo et al. | 326/81 |
| 5,054,001 | 10/1991 | Gillot | 326/83 |
| 5,157,280 | 10/1992 | Schreck et al. | 327/537 |
| 5,493,244 | 2/1996 | Pathak et al. | 327/313 |
| 5,650,742 | 7/1997 | Hirano | 327/333 |
| 5,748,025 | 5/1998 | Ng et al. | 327/333 |
| 5,767,728 | 6/1998 | Michail et al. | 327/374 |

*Primary Examiner*—Terry D. Cunningham
*Attorney, Agent, or Firm*—Fliesler Dubb Meyer & Lovejoy

[57] ABSTRACT

An output buffer including transistors which tolerate a maximum gate to source, gate to drain, or drain to source voltage ("the maximum tolerable voltage"), such as 2.7 volts, the transistors being configured to produce an output voltage significantly higher than the maximum tolerable voltage. The output buffer includes pull up transistors having source to drain paths connected in series to connect a voltage supply higher than the maximum tolerable voltage to the buffer output. The buffer further includes pull down transistors having source to drain paths connected in series to connect the buffer output to ground. The buffer further includes power supply circuitry to apply gate voltages to the pull up and pull down transistors so that the voltage potential from the source to drain of each of the pull up and pull down transistors is less than the maximum tolerable voltage. The power supply circuitry further controls gate voltages so that neither the gate to source, nor the gate to drain voltage for each of the pull up and pull down transistors exceeds the maximum tolerable voltage. Additionally, the power supply circuitry is itself configured so that voltage across the gate to source, gate to drain, or source to drain for each of its transistors does not exceed the maximum tolerable voltage. The power supply circuitry further provides a tristate configuration so that voltages can be applied to the buffer output from an external source exceeding the maximum tolerable voltage without a voltage from the gate to source, gate to drain, or source to drain of a transistor in the output buffer exceeding the maximum tolerable voltage.

13 Claims, 3 Drawing Sheets

OUTPUT BUFFER FOR MAKING A 5.0 VOLT COMPATIBLE INPUT/OUTPUT IN A 2.5 VOLT SEMICONDUCTOR PROCESS

BACKGROUND OF THE INVENTION

1. Field of the Invention

The present invention relates to an output buffer which provides a signal from a first circuit to a second circuit which operates with signals at a higher voltage level than the first circuit.

2. Description of the Related Art

With microprocessors manufactured using process technology enabling transistor size to be reduced well below submicron level, the maximum source to drain, gate to drain and gate to source voltage which such transistors can tolerate is likewise reduced. For instance, with one process referred to here as a 2.5 volt circuit process, transistor gate oxide thickness is reduced so that the maximum gate to source, gate to drain, or drain to source voltage a microprocessor transistor can tolerate without failure is approximately 2.7 volts.

The reduced size of the transistors utilized in microprocessors enables an increase in operation speed as well as an increase in density of transistors which can be integrated onto a single chip. Because of the increase in speed and density of transistors, the process technology utilized in manufacturing microprocessors is also desirable for use in other circuits.

For example programmable logic devices (PLDs), such as field programmable gate arrays (FPGAs), are some times utilized to perform the function similar to a microprocessors. The desirable operation speed and transistor density for PLDs is similar to microprocessors, so it would be desirable to use the same processing technology to manufacture such PLDs. However, unlike microprocessors, PLDs are utilized as glue logic to connect to devices with an operation voltage range which transistors made using the 2.5 volt circuit process will not tolerate.

For instance, PLDs typically connect to CMOS logic devices which operate over a 0–5 volt range, as well as TTL devices which operate over a 0–3.3 volt range. Although a transistor made using the 2.5 volt circuit process can produce a TTL output high of 2.4 volts, it is desirable for such a device to produce a voltage significantly higher than the 2.4 volt legal output high to assure errors do not occur.

SUMMARY OF THE INVENTION

The present invention provides an output buffer including transistors which tolerate a maximum gate to source, gate to drain, or drain to source voltage (hereinafter "the maximum tolerable voltage"), such as 2.7 volts for the 2.5 volt circuit process, the transistors being configured to produce a voltage significantly higher than the maximum tolerable voltage at the buffer output.

The present invention is an output buffer including a pull up transistors having source to drain paths connected in series to connect a voltage reference higher than the maximum tolerable voltage to an output of the buffer. The buffer further includes pull down transistors having source to drain paths connected in series to connect the buffer output to ground. The buffer further includes power supply circuitry to apply gate voltages to the pull up and pull down transistors so that the voltage potential from the source to drain of each of the pull up transistors and pull down transistors is less than the maximum tolerable voltage, even when the voltage at the buffer output is greater than the maximum tolerable voltage.

The power supply circuitry further controls gate voltages so that neither the gate to source, nor the gate to drain voltage for each of the pull up and pull down transistors exceeds the maximum tolerable voltage. Additionally, the power supply circuitry is itself configured so that voltage across the gate to source, gate to drain, or source to drain for each of its transistors does not exceed the maximum tolerable voltage.

The power supply circuitry further provides a tristate configuration so that voltages can be applied to the buffer output from an external source exceeding the maximum tolerable voltage without a voltage from the gate to source, gate to drain, or source to drain of a transistor in the output buffer exceeding the maximum tolerable voltage.

BRIEF DESCRIPTION OF THE DRAWINGS

Further details of the present invention are explained with the help of the attached drawings in which.

DETAILED DESCRIPTION

A. Circuit of FIG. 1

Figure 1:
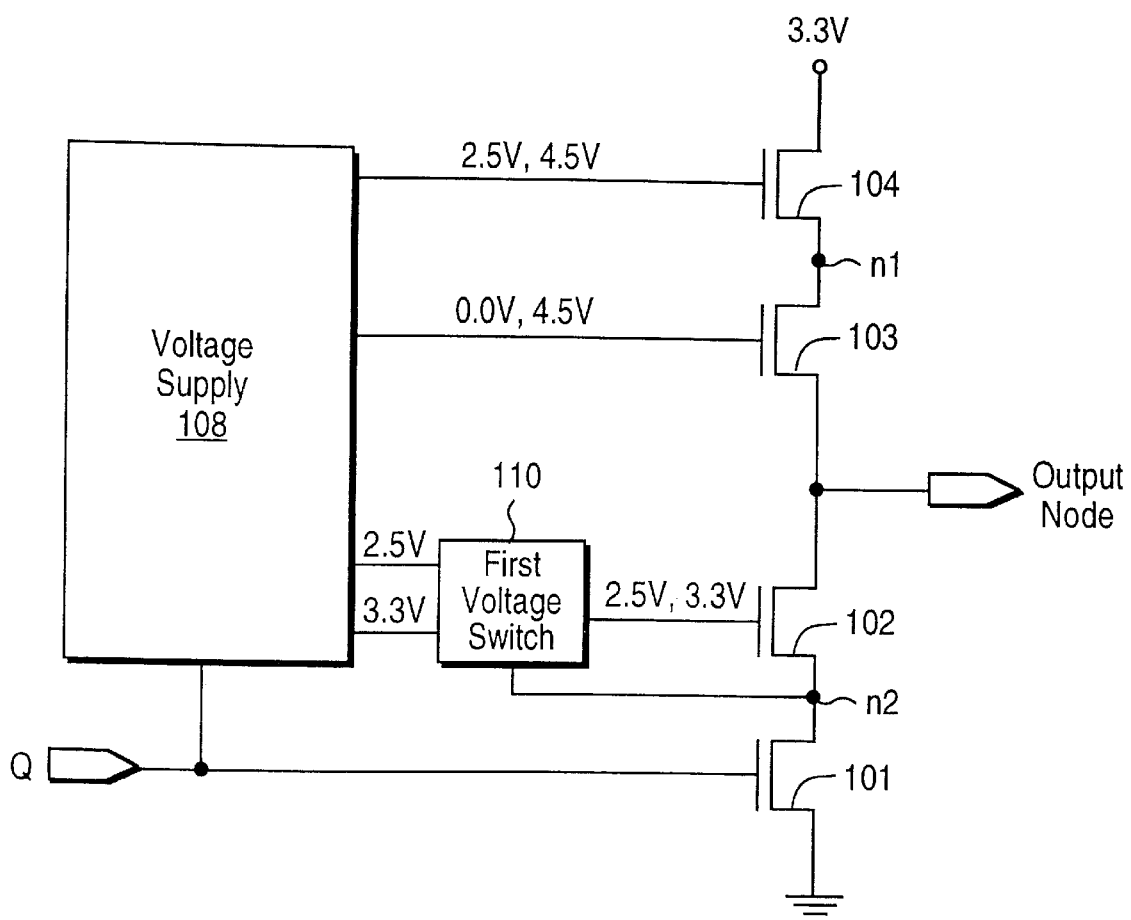
FIG. 1 illustrates components for the output buffer of the present invention.

FIG. 1 illustrates components for the output buffer of the present invention. The output buffer includes a set of series connected pull down NMOS transistors 101 and 102 having source to drain paths connecting an output node to ground. The output buffer also includes a set of series connected NMOS transistors 103 and 104 having source to drain paths connecting a voltage supply, shown here as a 3.3 volt supply, to the output node. Transistors 101–104 have a thin gate oxide region which will tolerate a maximum source to drain voltage of 2.7 volts. The transistors 101–104 will also only tolerate a maximum gate to drain and gate to source voltage of 2.7 volts.

An input Q to the output buffer is provided to the gate of transistor 101. The gates of transistors 102–104 are driven by power supply circuitry including voltage supply 108 and a first voltage switch 110. The voltage supply 108 operates to provide 2.5 volts to the gate of transistor 104 when Q is high and 4.5 volts to the gate of transistor 104 when Q is low. The voltage supply 108 also provides 0.0 volts to the gate of transistor 103 when Q is high and 4.5 volts when Q is low. The voltage supply 108 further provides 3.3 volts and $V_{CC}$, which here is 2.5 volts, to a first voltage switch 110. The first voltage switch 110 further receives feedback from node n2 and functions to apply 2.5 volts to the gate of transistor 102 when node n2 is low, and 3.3 volts when node n2 is high. The voltage supply 108 and first voltage switch 110 are controlled to apply voltages to the gates of transistors 101–104 so that the gate to drain, gate to source and drain to source voltages of the transistors 101–104 do not exceed a maximum of 2.7 volts.

NMOS transistors 103 and 104 are preferably utilized instead of PMOS transistors because if the voltage applied to the drain of one of the PMOS transistors exceeds its body voltage, it will forward bias its p+ to n-type well junction. To avoid forward biasing of the PMOS transistor, and enable PMOS transistors to be utilized for transistors 101 and 102, an n-type well in which the PMOS transistor is formed can be pumped to a higher voltage than a voltage applied to the drain of the PMOS transistor.

In operation, the input Q is first assumed to be high. With Q being high, transistor 101 will turn on, 2.5 volts will be applied to the gate of transistor 104, and 0.0 volts will be applied to the gate of transistor 103. With transistor 101 on, node n2 will be pulled to ground and the first voltage switch 110 will apply 2.5 volts to the gate of transistor 102 to turn it on. Since the source and drain of transistor 102 are at ground, the 2.5 volts applied to its gate, as opposed to 3.3 volts, will not exceed the maximum gate to source, or gate drain voltage of 2.7 volts. The voltage at the source of transistor 104 will be its gate voltage minus an NMOS threshold, assumed here to be approximately 0.7 volts, making the voltage at the source of transistor 104 (node n1) approximately 1.8 volts. Thus, the drain to source voltage drop across transistor 104 will be 1.5 volts which is less than the maximum tolerable 2.7 volts. With 0.0 volts applied to the gate of transistor 103, it will be turned off. With transistors 101 and 102 both being turned on by their gate voltage, the output node will be pulled to ground. The voltage drop across the source to drain of transistor 103 will then be 1.5 volts which is less than the maximum tolerable 2.7 volts.

With Q assumed to be low, transistor 101 will be off and 4.5 volts will be applied to the gates of transistors 103 and 104. With 4.5 volts applied to the gates of transistors 103 and 104, transistors 103 and 104 will both turn on to pass 3.3 volts to the output node. With transistor 101 turned off and 2.5 volts initially on the gate of transistor 102, node n2 will charge toward 2.5 volts so the first voltage switch 110 will transition the gate of transistor 102 from 2.5 to 3.3 volts. With 3.3 volts to the gate of transistor 102, its gate voltage minus an NMOS threshold, or 2.6 volts will be applied to the source of transistor 102 at node n2. None of the gate to source, gate to drain and source to drain voltage of transistor 102, thus, will exceed 2.7 volts. With transistor 101 turned off, the voltage drop across the source to drain of transistor 101 will then be 2.6 volts which is also less than the maximum tolerable 2.7 volts.

Although the voltage supply of 3.3 volts is used, and particular voltages are shown applied to the gates of transistors 101–104, other voltages can be used as long as the gate to drain, gate to source, and source to drain voltage for each of transistors 101–104 does not exceed the maximum 2.7 volts. Similarly, transistors having a different maximum gate to source, gate to drain, and source to drain voltage than 2.7 volts might be utilized, as long as the series connected pull down transistors, such as 101 and 102, are utilized in conjunction with the series pull up transistors, such as 103 and 104, and appropriate gate voltages are applied. Further, although FIG. 1 shows only two pull down transistors 101–102 and two pull up transistors 103–104, additional series connected transistors might be utilized if the two pull up and pull down transistors are insufficient to provide the desired voltage drop from a reference to the output node, or from the output node to ground.

B. Circuit of FIG. 2

Figure 2:
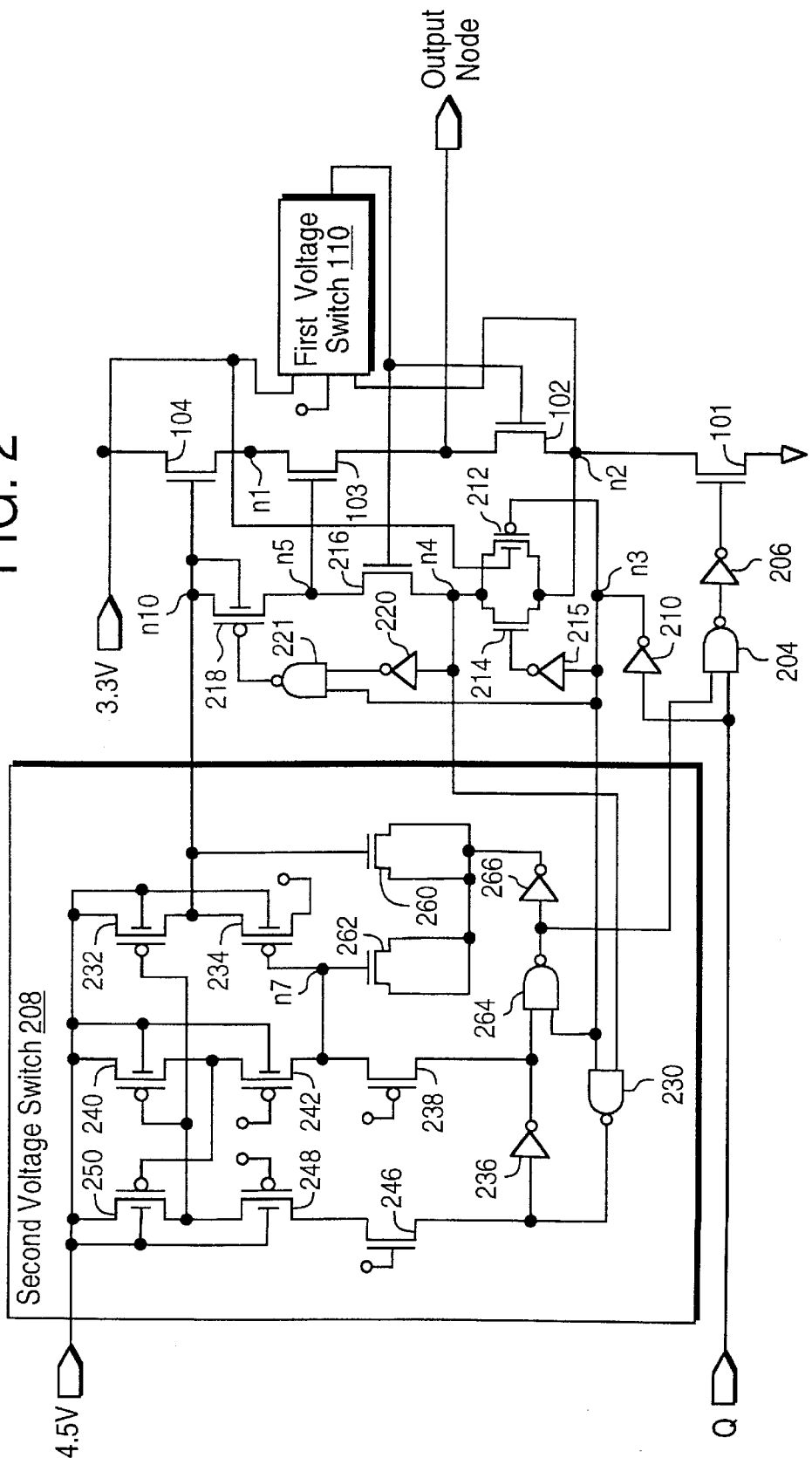
FIG. 2 shows one embodiment of circuitry used to provide the output buffer of FIG. 1.

FIG. 2 shows one embodiment of circuitry used to provide the output buffer of FIG. 1. Similar to FIG. 1, the circuit of FIG. 2 includes two series connected pull down transistors 101 and 102 connecting an output node to ground, and two series connected pull up transistors 103 and 104 connecting a 3.3 volt supply to the output node. Also as in FIG. 1, FIG. 2 further includes a first voltage switch 110 and circuitry to provide the voltage supply 108 of FIG. 1. Components carried over from FIG. 1 to FIG. 2 are similarly labeled, as will be components carried over in subsequent drawings. As in FIG. 1, the maximum tolerable gate to source, gate to drain and source to drain voltage for transistors is assumed to be 2.7 volts.

The Q input of the buffer of FIG. 2 is coupled to the gate of transistor 101 through a NAND gate 204 and an inverter 206. The NAND gate 204 has one input receiving the signal Q. The output of the NAND gate 204 is connected to the input of inverter 206. The output of inverter 206 is connected to the gate of transistor 101. The second input of the NAND gate 204 is provided from a second voltage switch 208 to effectively disable the signal Q from turning on the gate of transistor 101 until the second voltage switch 208 can switch from providing 4.5 volts to providing 2.5 volts at its output node n10.

The Q input is further provided through an inverter 210 to a node n3. Node n3 provides one input to the second voltage switch 208. Node n3 is further connected to the gate of CMOS pass gates made up of a PMOS transistor 212 and an NMOS transistor 214. Node n3 is connected to the gate of transistor 214 through inverter 215. The source to drain paths of transistors 212 and 214 connect the source of transistor 102 at node n2 to the source of transistor 216 at node n4. Transistor 216 has a drain connected to the gate of transistor 103 at node n5. A PMOS transistor 218 has a source to drain path connecting the gate of transistor 103 at node n5 to the gate of transistor 104 at node n10. The gate of transistor 218 is driven by a NAND gate 221 having one input connected to node n3 and another input connected through an inverter 220 to node n4.

As in FIG. 1, the first voltage switch 110 receives inputs from the 3.3 volt supply, $V_{CC}$ which here is 2.5 volts, and n2. The output of the first voltage switch is provided to the gate of transistor 102 as well as transistor 216. The first voltage switch 110 provides 3.3 volts at its output when node n2 is high and 2.5 volts at its output when node n2 is low.

The second voltage switch 208 includes a NAND gate 230 having one input provided from node n3, as indicated above. A second input of NAND gate 230 is provided from node n4. PMOS transistors 232 and 234 drive the output node n10 of the second voltage switch 208. The PMOS transistor 232 has a source to drain path connecting a 4.5 volt reference to node n10, while the PMOS transistor 234 has a source to drain path connecting $V_{CC}$, $V_{CC}$ being assumed to be 2.5 volts here, to node n10. Thus, if the PMOS transistor 232 is turned on, node n10 will be driven to 4.5 volts, and if PMOS transistor 234 is on, node n10 will be driven to 2.5 volts.

The gate of transistor 234 is coupled to the output of NAND gate 230 through an inverter 236 and source to drain path of an NMOS cascode transistor 238. The gate of transistor 234 is also coupled to the 4.5 volt reference through the source to drain path of PMOS transistor 240 and PMOS cascode transistor 242. The gate of transistor 232 is coupled to the output of NAND gate 230 through the source to drain paths of an NMOS cascode transistor 246 and a PMOS cascode transistor 248. The gate of transistor 232 is also coupled to the 4.5 volt reference through PMOS transistor 250. The gates of NMOS cascode transistors 238 and 246, as well as the gates of PMOS cascode transistors 242 and 248 are connected to $V_{CC}$ or 2.5 volts. The gate of transistor 240 is further connected to the gate of transistor 232 and the drain of transistor 250, while the gate of transistor 250 is connected to the drain of transistor 240. Transistors 240 and 250, thus, form a cross coupled pair.

Note that a cascode transistor, such as transistors 246, 238, 242 and 248, are transistors defined by being turned on and off by varying voltage applied to the source with the gate voltage fixed, rather than varying the gate voltage. In a cascode transistor with $(V_g-V_s)>V_t$, wherein $V_g$ is the gate voltage, $V_s$ is the source voltage, and $V_t$ is the threshold voltage of the transistor, the cascode transistor will turn on. With $(V_g-V_s)<V_t$, the cascode transistor will turn off.

Transistors 260 and 262 form capacitors utilized to pump nodes n10 and n7 so that the gate of transistor 104 quickly gets to a desired voltage level. Transistor 260 has a gate connected to node n10 and a source and drain connected to the output of inverter 236 through a series connected NAND gate 264 and inverter 266. Transistor 262 has a gate connected to node n7 and a source and drain connected to the output of inverter 266. A second input of NAND gate 264 is connected to node n3, while the output of NAND gate 264 is further connected to an input of NAND gate 204 to assure NAND gate 204 does not turn on transistor 101 until the voltage switch 208 has had time to switch.

All of the PMOS transistors shown in FIG. 2, and in subsequent drawings, are identified by a circle on their gate. An NMOS transistor has no circle on its gate.

In operation, the Q input is first assumed to be high. With Q high, the output of inverter 210 at node n3 will be low. With n3 low, the output of NAND gate 264 will be high. With NAND gate 264 and Q being high, the output of NAND gate 204 will be low and the output of inverter 206 will go high so transistor 101 will be turned on to pull node n2 to ground. With n3 low, transistors 212 and 214 will also turn on to pull node n4 to ground like node n2. With node n2 low, the output of the first voltage switch 110 will apply 2.5 volts to the gates of transistors 102 and 216. With transistor 216 being on, n5 will be pulled to ground like node n4. With n5 at ground, transistor 103 will be turned off. With transistor 102 being on and node n2 at ground, the output node will be pulled to ground. With node n3 low, the output of NAND gate 221 will be at 2.5 volts to drive the gate of transistor 218 high to turn it off and isolate node n10 from node n5. With Q high, the output of the second voltage switch 208 at node n10 will be at 2.5 volts as described in more detail below. With n10 at 2.5 volts, transistor 104 will partially turn on to drop node n1 to 2.5 volts minus an NMOS threshold of 0.7 volts, or to 1.8 volts. Thus, the drain to source voltage drop across transistor 104 will be 1.5 volts which is less than the maximum tolerable 2.7 volts. Further with 2.5 volts on the gates of transistors 102 and 216, as opposed to 3.3 volts, and zero volts on their source and drain, their gate to source and gate to drain voltage will be less than the maximum tolerable 2.7 volts.

The output of second voltage switch 208 with Q high will function to maintain node n10 at approximately 2.5 volts, as described below. As indicated above, with Q high nodes n3 and n4 will be low so the output of NAND gate 230 will be high. With the output of NAND gate 230 high, the output of inverter 236 will be low so that NMOS cascode 238 turns on to pull node n7 low, or to 0.0 volts. With the output of NAND gate 230 high, NMOS cascode 246 will turn off. With node n7 at 0.0 volts, PMOS transistor 234 will be on to provide $V_{CC}$ to node n10. With node n7 at 0.0 volts, $V_{CC}$ minus an PMOS threshold of typically –0.6 volts, or 3.1 volts will be placed on the gate of transistor 250. With the 4.5 volt reference applied to the source of transistor 250 and 3.1 volts on its gate, it will turn on to provide 4.5 volts to the gate of transistor 232 to assure transistor 232 is turned off. Note that 3.1 volts is applied to the gate of transistor 250 to assure its gate to source voltage is less than the maximum tolerable voltage of 2.7 volts. Similarly, the 3.1 volts is applied to the drain of transistor 240 to assure that its source to drain voltage does not exceed a maximum of 2.7 volts. With the gate of transistor 232 at 4.5 volts, the gate of transistor 240 will also be at 4.5 volts to turn it off so that node n7 will remain low. With the output of inverter 236 low, the output of NAND gate 264 will be high, and inverter 266 will provide a low output to the second end of capacitors 260 and 262.

With Q assumed to transition from high to low, the output of NAND gate 204 will transition to high to turn off transistor 101. Further, the output of inverter 210 will pull node n3 high to turn off transistors 212 and 214. With node n3 high, the NAND gate 221 will be enabled so that the voltage at node n4 will drive the gate of transistor 218 to prevent its gate to source and gate to drain voltage from exceeding a maximum of 2.7 volts. With node n4 initially at 0.0 volts, transistor 218 will be on to connect nodes n5 and n10. With node n10 being initially at approximately 2.5 volts, node n5 will also charge up toward 2.5 volts.

With 2.5 volts initially on the gate of transistor 102, and nodes n5 and n10 being at 2.5 volts to turn on transistors 103 and 104 to a degree, and transistor 101 being off, node n2 will charge up to approximately 1.8 volts. With node n2 going to 1.8 volts, the first voltage switch 110 will transition from providing 2.5 volts at its output to providing 3.3 volts. The gates of transistors 216 and 102 will, thus transition to 3.3 volts. With 3.3 volts on the gate of transistor 216, node n5 being at 2.5 volts, and transistors 212 and 214 being off, node n4 will charge up to approximately 2.5 volts. Note that with 3.3 volts on the gates of transistors 102 and 216 and their source and drain charging up to at least 1.8 volts, the maximum gate to source and gate to drain voltage of 2.7 volts will not be exceeded.

With Q going low, the output of second voltage switch 208 will function to maintain node n10 at approximately 4.5 volts, as described in detail below. With node n4 going to 2.5 volts, and node n3 being high, the output of NAND gate 230 will transition to low. With the output of NAND gate 230 low, the output of inverter 236 will go high to turn off cascode 238. With the output of NAND gate 230 low, cascode transistor 246 will turn on. With transistor 246 on, the source of PMOS cascode 248 will go to $V_{CC}$ minus a PMOS threshold of –0.6 volts, so a total of 3.1 volts will be applied to the gates of transistors 232 and 240 to turn them on. With transistor 232 being on, the 4.5 volt reference will be applied to node n10. Further, with transistor 240 being on, 4.5 volts will be applied through transistor 242 to transition node n7 to 4.5 volts and turn off transistor 234. 4.5 volts will also be applied to the gate of transistor 250 to turn it off.

With the output of inverter 236 being high, and node n3 being high, the output of NAND gate 264 will be low. With the output of NAND gate 264 low, inverter 266 will provide a high of 2.5 volts to capacitors 262 and 260. The capacitors 260 and 262 serve to assist transistor 232 in pulling node n10 to 4.5 volts.

With node n4 charging to 2.5 volts, 2.5 volts will be applied to the gate of transistor 218 by NAND gate 221. With 4.5 volts on the gate of transistor 218 at node n10, transistor 218 will still be on to provide 4.5 volts to node n5. With 2.5 volts instead of 0.0 volts on its gate, the gate to source voltage and gate to drain voltage of transistor 218 will not exceed a maximum tolerable value of 2.7 volts.

With the gates of transistors 103 and 104 both being at 4.5 volts, and transistor 101 being turned off, 3.3 volts will be applied to the output node. With 3.3 volts on the gate of transistor 102, a voltage drop of 2.6 volts will be provided across transistor 102 to charge node n2 to approximately 1.9 volts. With such voltages applied to transistors 101–104, none of their gate to drain, gate to source, or source to drain voltages will exceed the maximum tolerable 2.7 volts.

With Q transitioning back to high, node n3 will go low to turn on transistors 212 and 214. With node n3 going low, the output of NAND gate 230 will transition to high so that the second voltage switch 208 transitions from providing 4.5 volts at node n10 to providing 2.5 volts to n10. Transistor 101 will remain off until NAND gate 264 transitions to high due to the NAND gate 264 providing an input to NAND gate 204. Transistor 101 will remain off for a time necessary for the second voltage switch 208 to transition node n10 to 2.5 volts before transistor 101 connects node n2 to ground to prevent transistors 103 or 104 from exceeding the 2.7 volt maximum source to drain voltage drop. With node n3 low, NAND gate 221 will turn off transistor 218 to isolate node n10 from node n5, enabling node n5 to be pulled to ground to turn off transistor 103, while 2.5 volts remains on the gate of transistor 104. The description of the function of the circuit of FIG. 2 with Q initially high as explained previously can be referenced above for the remaining description of function where Q has transitioned to high.

C. Circuit of FIG. 3

Figure 3:
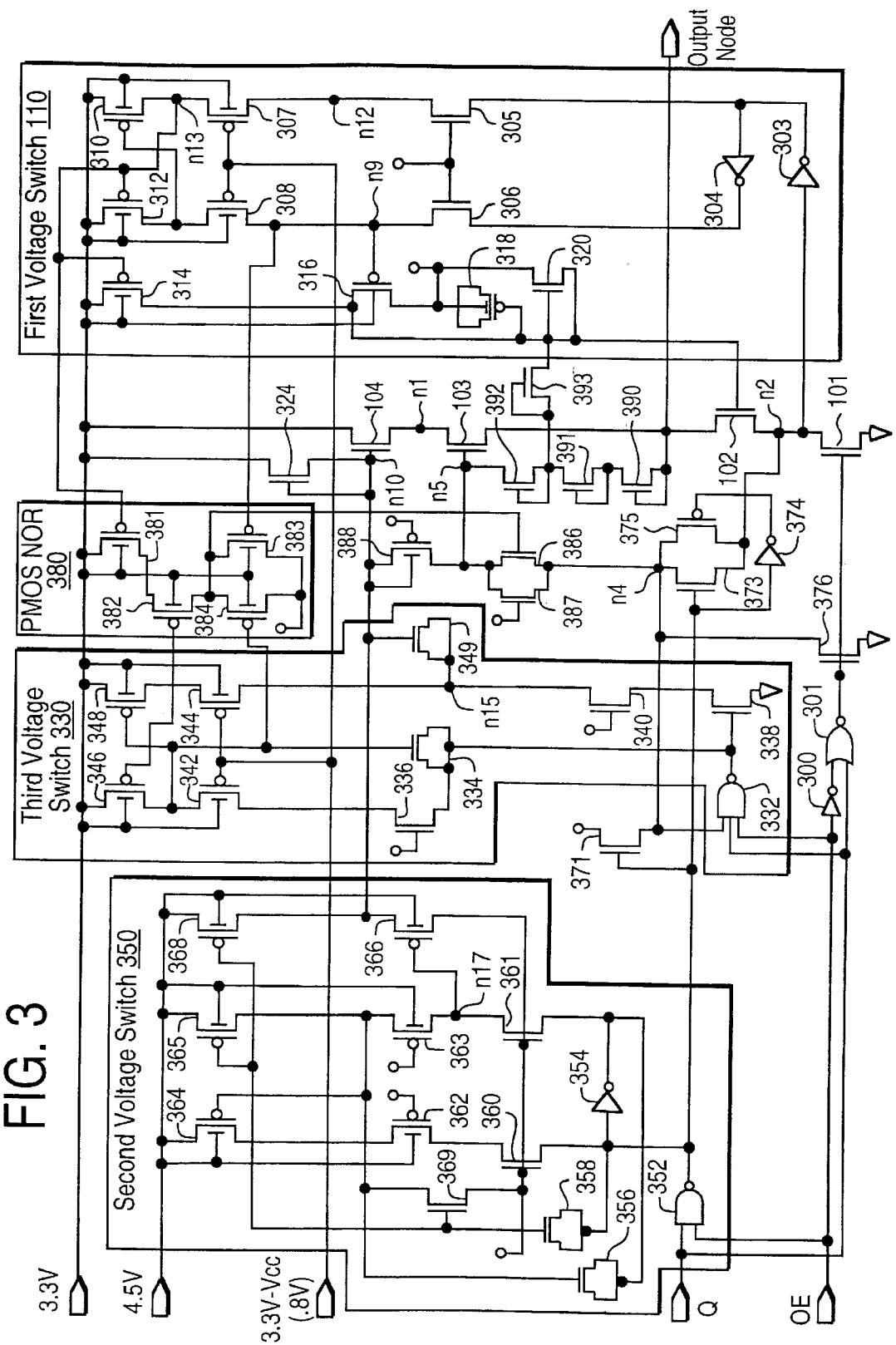
FIG. 3 shows another embodiment of circuitry used to provide the output buffer of FIG. 1.

FIG. 3 shows another embodiment of an output buffer of the present invention which includes specific circuitry for the first voltage switch 110 of FIGS. 1 and 2, and further includes additional circuitry to prevent the source to drain, gate to drain, or gate to source voltage of transistors in the output buffer from exceeding a maximum.

Similar to FIGS. 1 and 2, the circuit of FIG. 3 includes two series connected pull down transistors 101 and 102 connecting an output node to ground, and two series connected pull up transistors 103 and 104 connecting a 3.3 volt supply to the output node. As before, the maximum tolerable gate to source, gate to drain, and drain to source voltage for each of the transistors in FIG. 3 is assumed to be 2.7 volts.

1. Transistor 101 and its Driving Circuitry

Transistor 101 has a gate coupled to receive an input signal Q through a NOR gate 301. The NOR gate 301 enables a tristate mode since its second input is provided from an output enable signal (OE). The source of transistor 101 is connected to $V_{SS}$, while its drain is connected to node n2. The output of the NOR gate 301, thus functions to transition the input of transistor 101 between 0.0 volts and 2.5 volts. With the OE signal high, transistor 101 will turn on when Q goes low and turn off when Q goes high. With OE low, the output of NOR gate 301 will remain at 0.0 volts to keep transistor 101 off in a tristate mode.

Note in FIG. 3 the output node will be pulled low when Q goes low and OE is high to turn on transistor 101, while in FIGS. 1 and 2, the output node will go high when Q goes low. The reversed state of the output node in relation to the state of Q occurs due to the adding of the NOR gate 301 to accommodate the output enable (OE). If it is still desirable to have the output node low when Q goes high, an inverter can be added between the Q input and NOR gate 301.

2. Transistor 102 and its Driving Circuitry

Transistor 102 has a gate connected to a first voltage switch 110, similar to the transistor 102 of FIGS. 1 and 2. As before, the transistor 102 is not switched by its gate voltage, but remains always on. As in FIGS. 1 and 2, the first voltage switch 110 functions to prevent the gate to source and gate to drain voltage on transistor 102 from exceeding a 2.7 volt maximum. Thus, when the source of transistor 102 at node n2 is connected to ground, the first voltage switch 110 functions to provide 2.5 volts to the gate of transistor 102. When the source of transistor 102 is connected to a voltage greater than 1.5 volts, the first voltage switch 110 will function to increase the voltage at the gate of transistor 102 to 3.3 volts to assure node n2 can charge up to 2.5 volts and the output node can sustain an applied voltage of at least 5.0 volts.

The first voltage switch 110 includes an inverter 303 having an input connected to the source of transistor 102 at node n2, and an output connected to the source of an NMOS cascode transistor 305, and through an inverter 304 to the source of an NMOS cascode 306. The drain of transistor 305 is connected to the drain of PMOS cascode 307 at a node n12, while the drain of transistor 306 is connected to the drain of a PMOS cascode 308 at a node n9. The gates of transistors 305 and 306 are connected to $V_{CC}$, $V_{CC}$ here being 2.5 volts. The source of transistor 307 is connected at node nl3 to the drain of transistor 310, while the source of transistor 308 is connected to the drain of transistor 312. The gates of transistors 307 and 308 are connected to a supply having a voltage value of 3.3 volts minus $V_{CC}$, or 0.8 volts. Sources of transistors 310 and 312 are connected to the 3.3 volt supply. The gate of transistor 310 is connected to the drain of transistor 312, while the gate of transistor 312 is connected to node n13. Transistors 310 and 312, thus, form a cross-coupled pair. The source of a transistor 314 is connected to the 3.3 volt supply. The drain of transistor 316 is connected to $V_{CC}$. The drain of transistor 314 is connected to the source of transistor 316 and to the gate of transistor 102. The first end of a capacitor 318 and the drain of a clamp transistor 320 are connected to $V_{CC}$. The second end of capacitor 318 and the source and gate of clamp transistor 320 are connected to the gate of transistor 102. The gate of transistor 316 is connected to node n9. The gate of transistor 314 is connected to node n13.

In operation with the first voltage switch 110, Q is first assumed low with OE high to turn on transistor 101 to pull node n2 to ground. The output of inverter 303 will then be high to shut off NMOS cascode 305 and cause the output of inverter 304 to be low. With the output of inverter 304 low, NMOS cascode 306 will be on to pull node n9 low. With node n9 low, transistor 316 turns on to pull the gate of transistor 102 to $V_{CC}$. With n9 low, PMOS 308 pulls the gate of transistor 310 low to turn on transistor 310 to connect the 3.3 volt supply to node n13. With 3.3 volts on node n13, transistors 312 and 314 are turned off. With transistor 314 off, the 3.3 volt supply is not connected to the gate of transistor 102. The gate of transistor 102 is, thus, maintained at $V_{CC}$, or 2.5 volts.

It is next assumed that a low to high transition of the output node occurs. This can occur with Q going high and OE remaining high. This can also occur with OE going low to tristate the output and the output node being externally pulled high. With the output node high and transistor 102 being on as always, transistor 102 will pass the high from the output node to the input of inverter 303 so that the output of inverter 303 goes low. A low to high transition at the output node will, because of capacitive coupling, also push the gate of transistor 102 high. Capacitor 318 is appropriately sized so that the voltage swing at the gate of transistor 102 is an NMOS threshold so that the gate of transistor 102 goes only up to 3.2 volts. With the output of inverter 303 low, NMOS cascode 305 turns on to pull node n12 to 0.0 volts. With n12 at 0.0 volts, PMOS transistor 307 pulls node n13 low and, thus, the gate of transistors 312 and 314 low to turn on transistors 312 and 314. With transistor 314 on, 3.3 volts will be passed to the gate of transistor 102. Clamp transistor 320 will limit the voltage at the gate of transistor 102 to 3.3 volts. With the output of inverter 303 low, the output of inverter 304 will go high to turn off transistor 306. With transistor 312 on, node n9 will be pulled high through cascode 308 to turn off transistor 316. With 3.3 volts on its gate, the NMOS threshold of transistor 102 will make the voltage at node n2 approximately 2.5 volts when 3.3 volts is applied to the gate of transistor 102.

3. Transistor 104 and its Driving Circuitry

The gate of pull-up transistor 104 is driven by a second voltage switch 350 which, similar to the second voltage switch 208 of FIG. 2, functions to transition the gate of transistor 104 at node n10 between 2.5 and 4.5 volts. The gate of transistor 104 is further driven by a third voltage switch 330 which functions to assist the second voltage switch 350 in transitioning node n10 between 2.5 and 4.5 volts. After a transition of node n10 to 4.5 volts, clamp transistor 324 controls the overdrive of transistor 104 to limit the voltage on node n10 to 4.5 volts.

i. Third Voltage Switch 330

The third voltage switch 330 includes a capacitor 349 connected on a first end to node n10. The third voltage switch functions to drive node n15 at the second end of capacitor 349 to pump node n10 to 4.5 volts, or pull node n10 back down to 2.5 volts.

The third voltage switch 330 also includes a three input NAND gate 332 having a first input provided by the input signal Q, a second input provided from an output enable signal OE, and a third input provided from a transistor 371. The output of NAND gate 332 is connected to the second input of a capacitor 334, the source of an NMOS cascode 336 and the gate of an NMOS pull down transistor 338. The source of transistor 338 is connected to the source of an NMOS cascode 340. Gates of cascodes 336 and 340 are connected to $V_{CC}$. The source of cascode 340 is connected to the drain of PMOS cascode 344 at a node n15, while the source of cascode 336 is connected to the drain of PMOS cascode 342. The gates of PMOS cascode transistors 342 and 344 are connected to the voltage supply providing 3.3 volts minus $V_{CC}$, or 0.8 volts. The source of cascode 342 is connected to the drain of a PMOS transistor 346 and the gate of a PMOS transistor 348. The source of cascode 344 is connected to the drain of PMOS transistor 348 and the gate of PMOS transistor 346. Sources of transistors 346 and 348 are connected to the 3.3 volt supply. Transistors 346 and 348, thus, form a cross-coupled pair.

In operation with the third voltage switch 330, the output of NAND gate 332 is first assumed to be high. This will occur with Q high, OE high, and n5 being pulled sufficiently high to pull the drain of transistor 371 high. With the output of NAND gate 332 high, NMOS pull down transistor 338 turns on to pull the source of cascode 340 to 0.0 volts. Cascode 340 then conducts to pull node n15 to 0.0 volts and drain charge from capacitor 349 to pull node n10 down toward 2.5 volts. With node n15 at 0.0 volts, PMOS cascode 344 pulls the gate of transistor 346 low to turn it on. With transistor 346 on, the 3.3 volt supply is connected to the gate of transistor 348 to turn it off, and to a first terminal of capacitor 334. Transistor 346 being on in conjunction with transistor 342 pulls the drain of transistor 336 to 3.3 volts.

It is next assumed that the output of NAND gate 333 goes low. This can occur when any of Q, OE, or node n4 are pulled low. With the output of NAND gate 332 low, the NMOS pull down transistor 338 is turned off. With the output of NAND gate 332 low, capacitor 334 will further pull charge from the gate of PMOS driver transistor 348 to turn it on. With transistor 348 on, the gate of transistor 346 will go to 3.3 volts to turn it off, and node n15 will be pulled up to 3.3 volts through transistor 344. With node n15 at 3.3 volts, capacitor 349 will pump node n10 toward 4.5 volts. Clamp transistor 324 will limit the voltage on node n10 to 4.5 volts. The output of NAND gate 332 being low also turns on NMOS cascode 336 to provide 0.0 volts to the drain of transistor 342. With 0.8 volts on the gate of transistor 342, it will not pull the gate of transistor 348 below 0.8 volts.

Transistor 348 will then have a minimal amount of voltage to enable it to remain on, while not having a gate to source voltage drop greater than the maximum tolerable 2.7 volts.

ii. Second Voltage Switch 350

Similar to the circuit 208 of FIG. 2, the circuit 350 includes PMOS transistors 368 and 366 to drive the output node n10 of the second voltage switch 208. The PMOS transistor 368 has a source to drain path connecting a 4.5 volt supply to node n10, while the PMOS transistor 366 has a source to drain path connecting $V_{CC}$, $V_{CC}$ being assumed to be 2.5 volts here, to node n10. Thus, if the PMOS transistor 368 is turned on, node n10 will be maintained at 4.5 volts, and if PMOS transistor 366 is on, node n10 will be maintained at 2.5 volts.

The second voltage switch 350 further includes a NAND gate 352 having a first input receiving the Q input, and a second input connected to receive the output enable (OE) signal. The output of NAND gate 352 is connected to the source of an NMOS cascode 360, a second terminal of a capacitor 356, and through an inverter 354 to the source of an NMOS cascode 361. The gates of the NMOS cascodes 360 and 361, as well as to the source of transistor 369 are connected to $V_{CC}$. A PMOS cascode 362 has a drain connected to the drain of transistor 360, while an additional PMOS cascode 363 has a drain connected to the drain of transistor 361 at a node n17. Gates of transistors 362 and 363 are connected to $V_{CC}$. A PMOS transistor 364 has a source to drain path connecting a 4.5 volt supply to the source of transistor 362, while a PMOS transistor 365 connects the 4.5 volt supply to the source of transistor 363. A gate of transistor 364 is connected to the source of transistor 363, while the gate of transistor 365 is connected to the source of transistor 362. The gate of the 2.5 volt PMOS driver transistor 366 is connected to node n17. The gate of 4.5 volt PMOS driver transistor 368 is connected to the gate of transistor 365, to the drain of transistor 364, and to the first end of a capacitor 358. The gate of transistor 364 is also connected to the drain of transistor 369 and to the first end of a capacitor 356. A second end of capacitor 356 is connected to the output of inverter 354.

In operation with the second voltage switch 350, either the Q input or OE is initially assumed to be low. With Q or OE low, the second voltage switch 350 will function to maintain node n10 at 2.5 volts, as described below. With Q low, the output of NAND gate 352 will be high. With the output of NAND gate 352 high, the output of inverter 354 will go low to turn on NMOS cascode 361 to pull node n17 to 0.0 volts. With the output of NAND gate 352 high, cascode 360 will turn off. With node n17 now at 0.0 volts, transistor 366 will turn on to on connect the gate of transistor 104 at node n10 to $V_{CC}$, or 2.5 volts. With node n17 at 0.0 volts, transistor 363 will pass a low of VCC plus its threshold placing the source of transistor 363 at approximately 3.1 volts. With the source of transistor 363 at 3.1 volts or less, transistor 364 will turn on to connect the 4.5 volt supply to the gates of transistors 365 and 368 to turn them off. The 4.5 volt supply will also be connected by transistor 364 to the gate of transistor 369 and a first terminal of capacitor 358. With 3.1 volts on the gate of transistor 364, it will remain on without its gate to source voltage exceeding a maximum of 2.7 volts. With 3.1 volts on the drain of transistor 365, its source to drain voltage will not exceed a maximum of 2.7 volts.

Transistor 369 functions to assure the source of transistor 363 is pulled up to $V_{CC}$ minus an NMOS threshold, or 1.9 volts during power up to assure the gate to drain voltage of transistor 364 remains less than the 2.7 volt maximum, and the source to drain voltage across transistor 365 is less than the 2.7 volt maximum. Capacitor 358 couples the 2.5 volt transition at the output of NAND gate 352 to the gates of transistors 365 and 368 to speed up switching action for those transistors. Capacitor 356 does the same for transistor 364.

With Q going high and OE being high, the second voltage switch 350 will function to transition node n10 to 4.5 volts, as described below. With Q going high and OE being high, the output of NAND gate 352 will transition to low. With the output of NAND gate 352 low, the output of inverter 354 will then go high to turn off cascode 361. With the output of NAND gate 352 low, cascode transistor 360 will turn on. With transistor 360 on, the source of PMOS cascode 362 will go to $V_{CC}$ plus its threshold, placing a total of 3.1 volts on the gates of transistors 365 and 368 to turn them on, while preventing their gate to source voltage from exceeding a maximum of 2.7 volts. With transistor 368 being on, 4.5 volts will be applied to node n10. Further, with transistor 365 being on, 4.5 volts will be applied through transistor 363 to transition node n17 to 4.5 volts and turn off transistor 366. 4.5 volts will also be applied to the gate of transistor 364 to turn it off.

4. Transistor 103 and its Driving Circuitry

FIG. 3 includes additional circuitry to drive transistor 103, and to assure that the gate to drain, gate to source and source to drain voltage of transistors in the output buffer do not exceed the maximum tolerable amount of 2.7 volts.

The additional circuitry of FIG. 3 includes a PMOS transistor 371 having a gate connected to the output of NAND gate 352 and a source to drain path connecting $V_{CC}$ to a node n4. FIG. 3 further includes a CMOS pass gate made up of an NMOS transistor 373 and a PMOS transistor 375, each having a source to drain path connecting node n4 to the source of transistor 102 (node n2). The gate of transistor 373 is connected directly to the output of NAND gate 352, and the gate of transistor 375 is connected to the output of NAND gate 352 through an inverter 374. Transistor 376 has a gate connected to the output of NOR gate 301, a drain connected to node n4 and a source connected to $V_{SS}$.

FIG. 3 further includes a PMOS NOR gate 380. The PMOS NOR gate includes transistors 381–384, and has inputs provided from the drains of transistors 346 and 348 of the third voltage switch 330, and from nodes n9 and n13 of the first voltage switch 110. The output of NOR gate 380 is connected to the gate of a transistor 386. Transistors 386 and 387 both have a source to drain path connecting node n4 to the gate of transistor 103 at node n5. The gate of transistor 387 is connected to $V_{CC}$.

A transistor 388 has a source to drain path connecting node n10 to node n5 and a gate connected to $V_{CC}$. Transistors 390–392 have source to drain paths connected in series to connect node n5 to the output node. Transistor 393 has a source to drain path connecting the source of transistor 392 to the gate of transistor 102 to provide over voltage protection. The gates of transistors 390–393 are connected to their respective drains.

Operation of the circuitry driving the gate of transistor 103 is dependent upon all of the first voltage switch 110, second voltage switch 350 and third voltage switch 330, so operation is explained in the context of the entire circuit of FIG. 3 provided below.

i. Input Q Low

In operation, the input signal Q is first assumed to be low, while the output enable OE is high. With Q low and OE high, the output of NAND gate 352 goes high to shut off PMOS transistor 371 and turn on transistors 373 and 375. With OE high to drive the output of inverter 300 low, the output of NOR gate 301 goes high to turn on transistor 101 to pull node n2 to 0.0 volts. With transistor 102 always on, the output node will also be pulled low. With transistors 373 and 375 on, node n2 will also pull down node n4. With the output of NOR gate 301 being high, transistor 376 will also be turned on to speed up pull node n4 down to 0.0 volts. With node n2 at 0.0 volts, the first voltage switch 110 will drives the gate of transistor 102 to 2.5 volts, which places node n9 at 0.0 volts and node n13 at 3.3 volts. Transistor 383 in NOR gate 380 will then turn on to connect 2.5 volts to the gate of transistor 386. Node n4 being at 0.0 volts then pulls the gate of transistor 103 at node n5 to 0.0 volts through transistors 386 and 387.

With Q low, the output of NAND gate 332 will be high so the third voltage switch 330 will drive node n15 to 0.0 volts. With node n15 at 0.0 volts, capacitor 349 connecting node n15 to node n10 will pull down node n10 toward 2.5 volts. With the output of NAND gate 352 being high, the second voltage switch 350 will maintain node n10 at 2.5 volts. With node n10 at 2.5 volts, cascode 388 will turn off to isolate node n10 at the gate of transistor 104 from node n5 at the gate of transistor 103, node n5 being at 0.0 volts.

ii. Input Q Low to High Transition

On a low to high transition of the Q input with OE also high, the output of NOR gate 301 turns off transistors 376 and 101. The output of NAND gate 352 then also goes low which turns on PMOS transistor 371 and turns off pass gates 373 and 375. Further, after nodes n4 and n5 are pulled high by transistor 371, the output of NAND gate 332 will go low so that the third voltage switch 330 will transition node n15 to 3.3 volts which pushes node n10 from 2.5 volts to 4.5 volts. With the output of NAND gate 352 high, the second voltage switch 350 will then function to maintain node n10 at the gate of transistor 104 at 4.5 volts. As node n10 rises, PMOS cascode 388 then turns on raising node n5 at the gate of transistor 103 from 2.5 volts to 4.5 volts which allows transistor 103 to pass 3.3 volts.

As the output node goes high, the gate of transistor 102 will be increased to 3.3 volts by first voltage switch 110, and node n9 will go to 3.3 volts, while node n13 goes low, or to 1.8 volts.

With the third voltage switch 330 driving node nl5 high, transistor 382 of NOR gate 380 is turned off and transistor 384 is turned on connecting the gate of transistor 386 to 2.5 volts. With transistor 383 being a weak transistor, it provides a high impedance, and thus capacitive coupling, to the gate of transistor 386. When node n4 transitions from low to high, the gate of transistor 386 is coupled toward 3.3 volts enabling 2.5 volts to pass to node n5 to speed up switching. Transistor 386, thus, remains on during a low to high transition of Q, and is transitioned by NOR gate 380 from a gate voltage as high as 3.3 volts enabling it to provide 2.5 volts from node n4 to n5, to a gate voltage of 2.5 volts enabling it to provide 1.8 volts from node n4 to node n5.

iii. Input Q High to Low Transition

The input Q transitioning back from high to low and OE being high causes the third voltage switch 330 to drive node n15 back to 0.0 volts. With node n15 going to 0.0 volts, capacitor 349 pulls charge from node n10 bringing it from 4.5 volts back toward 2.5 volts. With Q going low, the output of NAND gate 352 will go high and the second voltage switch 350 will maintain node n10 at 2.5 volts. With 2.5 volts on node n10, transistor 388 will turn off to isolate n10 and node n5.

With the output of NAND gate 352 high, PMOS transistor 371 will turn off and pass transistors 373 and 374 will turn on. NOR gate 301 turns on transistors 376 and 101 to pull down node n4 and to pull the output node low through transistor 102 which is on. The first voltage switch 110 then drives the gate of transistor 102 to 2.5 volts, and transitions node n9 to 0.0 volts and node n13 to 3.3 volts. With node n13 at 3.3 volts and node n9 at 0.0 volts, NOR gate 380 applies 2.5 volts through transistor 383 to the gate of transistor 386. With node n4 low, node n5 will also be pulled to 0.0 volts through transistor 386 and 387.

iv. Tristate Condition

The tristate condition varies from the conditions described above where Q is low except that OE goes low to transition the output of NOR gate 301 to 0.0 volts to turn off transistors 101 and 376. The circuitry controlling the gate of transistor 102 will still transition, but will only depend on voltage which appears on the output node rather than the state of transistor 101.

In particular, the second voltage switch 350 will help assure the gate of transistor 104 is held at 2.5 volts. With transistor 387 always on and the output of NOR gate 352 high, a link path exists connecting the gate of transistor 103 to the output node through transistors 102, 373, 375, 386 and 387. With the link path, when the output node is at 0.0 volts, 0.0 volts appears at the gate of transistor 103. As the output node is pulled high, transistor 102 will pass a voltage less than or equal to 2.5 volts due to voltage provided its gate from the first voltage switch 110, as described previously. When the drain of transistor 102 raises to a value exceeding the threshold of inverter 303 in the first voltage switch 110, node n13 will go low and the drain of transistor 348 in the third voltage switch 350 will go low to cause transistors 381 and 382 in NOR gate 380 to pull the gate of transistor 386 to 3.3 volts. This will allow a voltage up to 2.5 volts to be passed to the gate of transistor 103 at node n5. As the output node voltage continues to rise, the voltage at node n5 will not continue to increase significantly until the output node voltage exceeds three times an NMOS threshold above 2.5 volts, at which time transistors 390–392 will push node n5 until a point where PMOS transistor 388 clamps the voltage at 3.3 volts.

When the output node voltage drops below 2.5 volts, the transistors 390–392 in the link path must be sized appropriately to provide a low enough impedance to keep transistor 103 off. Should an over voltage condition occur to significantly raise the voltage on the output node, transistors 390–393 will serve to pull up the gate of transistor 102 to prevent damage to transistors of the output buffer.

Although the present invention has been described above with particularity, this was merely to teach one of ordinary skill in the art how to make and use the invention. Many additional modifications will fall within the scope of the invention, as that scope is defined by the claims which follow.

What is claimed is:

1. An output buffer comprising:
   a first plurality of transistors having source to drain paths connected in series to couple $V_{SS}$ to an output node, each of the first plurality of transistors having a maximum drain to gate voltage and a maximum tolerable gate to source voltage, wherein the first plurality of transistors comprise:
   a first transistor (101) having a source to drain path coupled on a first end to $V_{SS}$, and having a gate coupled to receive a buffer input signal Q; and
   a second transistor (102) having a source to drain path coupling a second end of the first transistor at a node n2 to the output node, and having a gate;

a second plurality of transistors having source to drain paths connected in series to couple a first voltage potential to the output node, each of the first plurality of transistors having the maximum tolerable gate to source voltage which is less than the first voltage potential and the maximum tolerable drain to gate voltage which is less than the first voltage potential, wherein the second plurality of transistors comprise:
   a third transistor (103) having a source to drain path coupled on a first end to the output node, and having a gate; and
   a fourth transistor (104) having a source to drain path coupling a second end of the third transistor at a node n1 to the first voltage supply, and having a gate;

a power supply (108) controlled to apply voltages to the gates of the first and second plurality of transistors to maintain a drain to gate voltage for each of the first and second plurality of transistors less than the maximum tolerable drain to gate voltage, and to maintain a gate to source voltage for each of the first and second plurality of transistors below the maximum tolerable gate to source voltage, the power supply receiving the buffer input signal Q and applying voltages to the gate of the third transistor (103) to turn the third transistor (103) on and off in correspondence with a state of the signal Q, the power supply (108) further:
   applying a second voltage potential to the gate of the fourth transistor (104) when the third transistor (103) is turned off so that the drain to gate voltage for the second plurality of transistors will be less than the maximum drain to gate voltage,
   applying a third voltage potential to the gate of the fourth transistor (104) when the third transistor (103) is turned on to enable the first voltage potential to be substantially provided to the output node, and
   applying a voltage potential to the gate of the second transistor (102) to turn it on so that with a voltage on the output node greater than the maximum drain to gate voltage and the first transistor (101) turned off, a voltage from the drain to gate of the second transistor (102) will be less than the maximum gate to drain voltage; and a first voltage switch (110) coupling the power supply (108) to the gate of the second transistor (102), the first voltage switch (110) further having an input coupled to node n2, the first voltage switch (110) being controlled to apply a first voltage from the power supply (108) to the gate of the second transistor (102) when the first transistor (101) is turned off and the output node voltage pulls node n2 above a predetermined value, and the first voltage switch (110) further applying a second voltage ($V_{CC}$) from the power supply (108) to the gate of the second transistor (102) to turn it on when node n2 is pulled below the predetermined level.

2. The output buffer of claim 1, wherein the voltage power supply (108) includes a second voltage switch (208,350) having an input coupled to receive the buffer input signal Q, and having an output connected at a node n10 to the gate of the fourth transistor (104), the second voltage switch (208, 350) applying the second voltage ($V_{CC}$) to node n10 when the buffer input signal Q is not provided indicating the output node should be high to turn on the fourth transistor (104) to create a voltage difference from the drain to gate of the fourth transistor (104) which is less than its maximum tolerable drain to gate voltage and to create a voltage at node n1 less than the maximum tolerable drain to gate voltage for the third transistor (103), and the second voltage switch (208,350) further applying the third voltage to node n10 so that the fourth transistor (104) will pass the first voltage supply from its source to drain when the buffer input signal Q is provided indicating the output node should be high.

3. The output buffer of claim 2, wherein the power supply (108) applies $V_{SS}$ to a gate of the third transistor (103) at node n5 to turn it off when the input signal Q is provided indicating the output node should be low, and applies the third voltage to node n5 so that the third transistor (103) passes the first voltage supply potential from its source to drain when the buffer input signal Q is provided indicating the output node should be high.

4. The output buffer of claim 2, wherein the second voltage switch (208,350) includes a NAND gate (352) which has a first input receiving the input signal Q, a second input receiving an output enable signal (OE), and provides an output.

5. The output buffer of claim 2, wherein the power supply (108) further includes a third voltage switch (330) having an input coupled to receive the buffer input signal Q, and including a capacitor (349), the capacitor (349) having a first end connected to node n10 and a second end connected to a node n15, the third voltage switch (330) applying $V_{SS}$ to node n15 when the buffer input signal Q is not provided indicating the output node should be high to assist the second voltage switch (350) in pulling down node n10, and the third voltage switch further applying the first voltage supply to node n15 to assist the second voltage switch in pulling up node n10 when the input signal Q is provided indicating the output node should be high.

6. The output buffer of claim 4, wherein the second voltage switch (350) further comprises:
a first NMOS cascode transistor (360) having a source connected to the output of the NAND gate (352), a gate connected to $V_{CC}$, and a drain;
an inverter (354) having an input connected to the output of the NAND gate (352) and an output;
a second NMOS cascode transistor (361) having a source connected to the output of the inverter (354), a gate connected to $V_{CC}$, and a drain;
a first PMOS cascode transistor (363) having a drain connected to the drain of the first NMOS cascode transistor (361) at a node n17, a gate connected to $V_{CC}$, and a drain;
a second PMOS cascode transistor (362) having a drain connected to the drain of the first NMOS cascode transistor (360), a gate connected to $V_{CC}$, and a drain;
a first PMOS transistor (365) having a drain connected to the source of the first PMOS cascode transistor (363), a source connected to the third voltage, and a gate connected to the source of the second PMOS cascode transistor (362);
a second PMOS transistor (364) having a drain connected to the source of the second PMOS cascode transistor (362), a source connected to the third voltage, and a gate connected to the drain of the first PMOS transistor (365);
a first PMOS driver transistor (366) having a gate connected to node n17, a source connected to $V_{CC}$, and a drain connected to the node n10;
a second PMOS driver transistor (368) having a gate connected to the gate of the first PMOS transistor (365), a source connected to the third voltage, and a drain connected to node n10;
a voltage protection NMOS transistor having a gate connected to the gate of the first PMOS transistor (365), a source connected to $V_{CC}$, and a drain connected to the gate of the second PMOS transistor (364);
a first capacitor (368) having a first terminal connected to the gate of the first PMOS transistor (365) and a second terminal connected to the output of the NAND gate (352); and
a second capacitor (356) having a first terminal connected to the gate of the second PMOS transistor (364) and a second terminal connected to the output of the inverter (354).

7. The output buffer of claim 6, wherein the power supply (108) further includes a third voltage switch (330) comprising:
a second NAND gate (332) having a first input receiving the input signal Q, a second input receiving the OE signal, and a third input connected to $V_{CC}$ by the source to drain path of a PMOS transistor (371) having a gate connected to the output of the NAND gate 352;
a first NMOS transistor (338) having a source connected to $V_{SS}$, a gate connected to the output of the second NAND gate (332), and a drain;
a third NMOS cascode transistor (336) having a source connected to the output of the second NAND gate (332), a gate connected to $V_{CC}$, and a drain;
a fourth NMOS cascode transistor (340) having a source connected to the drain of the third NMOS cascode transistor (338), a gate connected to $V_{CC}$, and a drain connected to a node n15;
a third PMOS cascode transistor (342) having a drain connected to the drain of the third NMOS cascode transistor (336), a gate connected to a voltage supply providing a voltage substantially equal to the first voltage supply minus $V_{CC}$, and a source;
a fourth PMOS cascode transistor (344) having a drain connected to the node n15, a gate connected to a voltage supply providing a voltage substantially equal to the first voltage supply value minus $V_{CC}$, and a source;
a third PMOS transistor (346) having a gate connected to the source of the fourth PMOS cascode transistor (344), a drain connected to the source of the third PMOS cascode transistor (342), and a source connected to the first voltage supply;
a fourth PMOS transistor (348) having a gate connected to the drain of the third PMOS transistor (346), a drain connected to the source of the fourth PMOS cascode transistor (344) and a source connected to the first voltage supply;
a third capacitor (334) having a first terminal connected to the output of the second NAND gate (332), and a second terminal connected to the gate of the fourth PMOS transistor (348); and
a fourth capacitor (349) having a first terminal connected to node n15 and a second terminal connected to node n10.

8. The output buffer of claim 3, wherein the voltage supply (108) further comprises:
a CMOS pass gate (212–214, 374–375) having a first source and drain connection connected to the node n2, a second source and drain connection connected to a node n4, and having gates coupled to receive the buffer input signal Q so that when the signal Q is provided indicating the output node should be low the CMOS pass gate turns on, and when the buffer signal Q is not provided indicating the output should be low the CMOS pass gate turns off;

a first connecting transistor (216, 386–387) having a source to drain path connecting node n4 to the node n5, and a gate connected to a voltage enabling the first connecting transistor to turn on; and a second connecting transistor (218, 388) having a source to drain path connecting the node n5 to the node n10 and a gate controlled to connect node n5 and n10 when the input signal Q is provided indicating the output node should be high, and to isolate node n5 from n10 when the input signal Q is not provided indicating the output node should be high.

9. The output buffer of claim 7 further comprising:

a second inverter (300) having an input receiving the OE signal and an output;

a NOR gate (301) having a first input connected to the output of the second inverter (300), a second input receiving the buffer input signal Q, and an output connected to the input of the first transistor (101);

a second NMOS transistor (373) having a gate connected to the output of the NOR gate (352), and a source to drain path connecting the node n2 to a node n4;

a third inverter (374) having an input connected to the output of the NAND gate (352) and having an output;

a fifth PMOS transistor (375) having a gate connected to the output of the third inverter (374), and a source to drain path connecting the node n2 to the node n4;

a sixth PMOS transistor (387) having a gate connected to $V_{SS}$, and a source to drain path connecting the node n4 to the node n5; and a seventh PMOS transistor (388) having a gate connected to $V_{SS}$, and a source to drain path connecting node n5 to node n10.

10. The output buffer of claim 9, wherein the first voltage switch (110) comprises:

a fourth inverter (303) having an input connected to node n2 and having an output;

a fifth inverter (304) having an input connected to the output of the fourth inverter (303) and having an output;

a fifth NMOS cascode transistor (305) having a source connected to the output of the fourth inverter (303) and a gate connected to $V_{CC}$;

a sixth NMOS cascode transistor (306) having a source connected to the output of the fifth inverter (304) and a gate connected to a voltage supply substantially equal to the first voltage supply minus $V_{CC}$;

a fifth PMOS cascode transistor (307) having a drain connected to a drain of the fifth NMOS cascode transistor (305) and a gate connected to a voltage supply substantially equal to the first voltage supply minus $V_{CC}$;

a sixth PMOS cascode transistor (308) having a drain connected to a drain of the sixth NMOS cascode transistor (306) at a node n9 and a gate connected to a voltage substantially equal to the first voltage supply minus $V_{CC}$;

an eighth PMOS transistor (310) having a drain connected to the source of the fifth PMOS cascode transistor (307) at a node n13, a source connected to the first voltage supply, and a gate connected to the source of the sixth PMOS cascode transistor (308);

a ninth PMOS transistor (312) having a drain connected to the source of the sixth PMOS cascode transistor (308), a source connected to the first voltage supply, and a gate connected to node n13;

a tenth PMOS transistor (314) having a gate connected to the node n13, a source connected to the first voltage supply, and a drain;

an eleventh PMOS transistor (316) having a gate connected to the node n9, a source connected to the drain of the tenth PMOS transistor (314), and a drain;

a fifth capacitor (318) having a first terminal connected to the drain of the eleventh PMOS transistor (316) and to $V_{CC}$, and a second terminal connected to the gate of the second transistor (102); and a third NMOS transistor (320) having a gate and source connected to the gate of the second transistor (102) and a drain connected to $V_{CC}$ and to the first terminal of the fifth capacitor (318).

11. The output buffer of claim 10 wherein the third voltage switch further comprises:

a fourth NMOS transistor (386) having a source to drain path connecting node n5 to node n6; and having a gate; and a PMOS NOR gate comprising;

a twelveth PMOS transistor (381) having a source to drain path connecting the first voltage supply to the gate of the fourth NMOS transistor (386), and having a gate connected to the node n13;

a thirteenth PMOS transistor (382) having a source to drain path connecting the first voltage supply to the gate of the fourth NMOS transistor (386), and having a gate connected to the gate of the third PMOS transistor (346);

a fourteenth PMOS transistor (383) having a source to drain path connecting $V_{CC}$ to the gate of the fourth NMOS transistor (386), and having a gate connected to the gate of the fourth PMOS cascode transistor (344);

a fifteenth PMOS transistor (384) having a source to drain path connecting $V_{CC}$ to the gate of the fourth NMOS transistor (386), and having a gate connected to the node n9.

12. An output buffer comprising:

a first plurality of transistors having source to drain paths connected in series to couple $V_{SS}$ to an output node, each of the first plurality of transistors having a maximum tolerable drain to gate voltage and a maximum tolerable gate to source voltage, the first plurality of transistors comprising:

a first transistor (101) having a source to drain path coupled on a first end to $V_{SS}$, and having a gate; and a second transistor (102) having a source to drain path coupling a second end of the first transistor at a node n2 to the output node, and having a gate;

a second plurality of transistors having source to drain paths connected in series to couple a first voltage supply to the output node, each of the first plurality of transistors having the maximum tolerable gate to source voltage which is less than the first voltage potential and the maximum tolerable drain to gate voltage which is less than the first voltage potential, the second plurality of transistors comprising:

a third transistor (103) having a source to drain path coupled on a first end to the output node, and having a gate;

a fourth transistor (104) having a source to drain path coupling a second end of the third transistor at a node n1 to the first voltage supply, and having a gate;

a power supply (108) controlled to apply voltages to the gates of the first and second plurality of transistors to maintain the drain to gate voltage for each of the first and second plurality of transistors less than the maximum tolerable drain to gate voltage, and to maintain a source to gate voltage for each of the first and second plurality of transistors below the maximum tolerable gate to source voltage; and a first voltage switch (110) coupling the power supply (108 to the gate of the second transistor (102), the first voltage switch (110) further having an input coupled to node n2, the first voltage switch (110) being controlled to apply a first voltage from the power supply (108) to the gate of the second transistor (102) when the first transistor (101) is turned off and the output node voltage pulls node n2 above a predetermined value, and the first voltage switch (110) further applying a second voltage ($V_{CC}$) from the power supply (108) to the gate of the second transistor (102) to turn it on when node n2 is pulled below the predetermined level.

13. The output buffer of claim 12, wherein the first voltage switch (110) comprises:

a first inverter (303) having an input connected to node n2 and having an output;

a second inverter (304) having an input connected to the output of the first inverter (303) and having an output;

a first NMOS cascode transistor (305) having a source connected to the output of first the inverter (303) and a gate connected to $V_{CC}$;

a second NMOS cascode transistor (306) having a source connected to the output of the second inverter (304) and a gate connected to $V_{CC}$;

a first PMOS cascode transistor (307) having a drain connected to a drain of the first NMOS cascode transistor (305) and a gate connected to a voltage substantially equal to the first voltage supply minus $V_{CC}$;

a second PMOS cascode transistor (308) having a drain connected to a drain of the second NMOS cascode transistor (306) at a node n9 and a gate connected to the voltage substantially equal to the first voltage supply value minus $V_{CC}$;

a first PMOS transistor (310) having a drain connected to the source of the first PMOS cascode transistor (307) at a node n13, a source connected to the first voltage supply, and a gate connected to the source of the second PMOS cascode transistor (308);

a second PMOS transistor (312) having a drain connected to the source of the second PMOS cascode transistor (308), a source connected to the first voltage supply, and a gate connected to node n13;

a third PMOS transistor (314) having a gate connected to the node n13, a source connected to the first voltage supply, and a drain;

a fourth PMOS transistor (316) having a gate connected to the node n9, a source connected to the drain of the third PMOS transistor (314), and a drain;

a capacitor (318) having a first terminal connected to the drain of the fourth PMOS transistor (316) and to $V_{CC}$, and a second terminal connected to the gate of the second transistor (102); and an NMOS transistor (320) having a gate and source connected to the gate of the second transistor (102) and a drain connected to $V_{CC}$ and to the first terminal of the capacitor (318).

* * * * *